(12) United States Patent
Khouri et al.

(10) Patent No.: US 6,424,121 B1
(45) Date of Patent: Jul. 23, 2002

(54) VOLTAGE GENERATOR SWITCHING BETWEEN ALTERNATING, FIRST AND SECOND VOLTAGE VALUES, IN PARTICULAR FOR PROGRAMMING MULTILEVEL CELLS

(75) Inventors: Osama Khouri, Milan; Rino Micheloni, Turate; Andrea Sacco, Alessandria; Guido Torelli, Sant'Alessio Con Vialone, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 52 days.

(21) Appl. No.: 09/714,837

(22) Filed: Nov. 15, 2000

(30) Foreign Application Priority Data

Nov. 16, 1999 (IT) ......................................... TO99A0993

(51) Int. Cl.$^7$ ............................................. H01M 10/46
(52) U.S. Cl. ....................................................... 320/128
(58) Field of Search ................................. 320/116, 118, 320/119, 128, 134, 136, 137

(56) References Cited

U.S. PATENT DOCUMENTS 4,145,572 A * 3/1979 Stewart
4,716,354 A * 12/1987 Hacker
5,563,496 A * 10/1996 McClure

* cited by examiner

Primary Examiner—Edward H. Tso
(74) Attorney, Agent, or Firm—Lisa K. Jorgenson; Robert Iannucci; Seed IP Law Group PLLC

(57) ABSTRACT

A voltage generator formed of a charge circuit and a discharge circuit having a common programmable voltage divider with variable resistance; the programmable voltage divider including a plurality of resistors arranged in series and selectively connectable to define alternatively a stepwise increasing program voltage and a fixed verify voltage. The charge circuit formed of a voltage regulator supplying at the output the precise voltage value determined by the programmable voltage divider, and the discharge circuit intervening when the output voltage must be switched in a controlled manner from a higher value to a lower value.

20 Claims, 5 Drawing Sheets

VOLTAGE GENERATOR SWITCHING BETWEEN ALTERNATING, FIRST AND SECOND VOLTAGE VALUES, IN PARTICULAR FOR PROGRAMMING MULTILEVEL CELLS

TECHNICAL FIELD

The present invention relates to a voltage generator, switching between alternating first and second voltage values, in particular for programming multilevel cells.

BACKGROUND OF THE INVENTION

As is known, a multilevel memory cell, for example of flash type, can be programmed such as to have one of N predetermined threshold voltages (or more specifically, one of N distributions of the threshold voltage), and can thus store a number M=log2 N of bits. This is obtained by injecting a controlled quantity of charge into a floating gate region of the cell. Consequently, each cell can store M bits, thus decreasing significantly the cost per bit in a specific production technology. The multilevel approach therefore becomes very attractive in applications such as the mass memory for portable computers, voice recorders, and digital retrieval devices (cameras), and other applications using mass memory.

In multilevel memories, on-chip circuits are required which can supply threshold voltages distributed at intervals sufficiently close and spaced, within a reduced period of time. The requirements are far more stringent than in the case of two-level memories: in particular, the broadness of distribution of each level is more critical; consequently, accurate control of the threshold voltage programmed is required.

One of the required on-chip circuits is the voltage generator, which must generate a stepped voltage for supplying the selected word line, and thus the gate terminal of the addressed cell, since there is a linear ratio between the increase in the threshold voltage $_\Delta V_T$ and the increase in the applied gate voltage $_\Delta V_{GP}$, if the drain voltage is kept constant. In particular, as described in C. Calligaro, A. Manstretta, A. Modelli and G. Torelli: "Technological and design constraints for multilevel flash memories". *Third IEEE Int. Conf. on Electronics, Circuits and Systems*, (ICECS), pp. 1005–1008, October 1996, the complete text of which is incorporated herein by reference, the following is obtained:

$$_\Delta V_T = _\Delta V_{GP}.$$

For obtaining this linear ratio the increase in threshold voltage $_\Delta V_T$ must be constant. In addition, in order to obtain distributions which are sufficiently close and spaced, it is necessary to have a high programming accuracy, which at present is obtained by alternating program steps, during which the threshold voltage is modified, and verify steps in which it is verified whether the reached threshold voltage corresponds to the required value.

In particular, during each program step, the gate terminal of the cell to be programmed is biased with a program voltage $V_{GP}$ which is higher than that of the preceding program step, as already explained, and during the verify steps, the cell to be programmed is read by feeding the gate terminal with a read voltage $V_{GR}$ which can differ considerably from the program voltage $V_{GP}$.

FIGS. 1 and 2 show the pattern of the voltages at the gate terminal of a cell in successive program and verify steps, in two different conditions. In the first case (FIG. 1), at the start of programming, the program or write voltage $V_{GP}$ is lower than the read voltage $V_{GR}$ (6 V); however in the second case (FIG. 2), the program or write voltage $V_{GP}$ is higher than the read voltage $V_{GR}$.

The word line addressed can be biased using a suitable voltage regulator, which generates the required stepped voltage, and is provided with a discharge circuit which discharges the addressed word line at the end of a program pulse. Then, the addressed word line is charged to the verify voltage through a different biasing circuit, and is then discharged once more.

The verify or program voltage can be discharged through an NMOS or PMOS discharge transistor connected to the output of the regulator, as shown in FIGS. 3 and 4.

In detail, FIG. 3 shows an NMOS transistor 50a, arranged between an output terminal 51 of a discrete-ramp voltage generator circuit and ground, and has a gate terminal connected to the output 52 of an inverter 53. The figure also shows with broken lines a capacitor 54, which represents the capacitance of the selected word line. The inverter 53 is connected between a supply line set to $V_{DD}$ and a ground line, and receives a digital signal S1. When the digital signal S1 is low (for example 0 V), the output 52 rises to the supply voltage value $V_{DD}$, thus switching on the NMOS transistor 50a, and consequently discharging the parasitic capacitance 54 to a voltage close to 0 V.

On the other hand the circuit illustrated in FIG. 4 shows a PMOS transistor 50b, and the inverter 53 is connected to the supply line $V_{DD}$ and to a reference line which is set to a voltage $V_F$ close to 0 V. In this case, when the digital signal S2 becomes high, the output of the inverter 53 reaches the reference voltage $V_F$. Thus, the PMOS transistor 50b permits discharge of the voltage present at the output terminal 51, only down to $V_F + |V_{TP}|$ wherein $V_{TP}$ is the threshold voltage of the PMOS transistor 50b, and then switches off, thus interrupting discharge.

The above-described solutions have some disadvantages. First, the manufacture of separate voltage generators for programming and reading involves a considerable space. In addition, the discharge to the ground or to a value close to ground, and subsequent charging of the addressed word line after each individual program and verify step, gives rise to a substantial consumption, and significant setting times, as a result of the high capacity associated with the word lines.

SUMMARY OF THE INVENTION

The present invention provides a voltage generator which overcomes the disadvantages of the prior art described above.

According to various aspects of the present invention, a voltage generator is provided having an output terminal supplying an output voltage that alternately switches between first and second values, the first values being greater than the second values. The voltage generator includes a charge circuit and a discharge circuit, both coupled to the output terminal. A programmable circuit is shared by the charge and discharge circuits, the programmable circuit having a programmable electrical value correlated to the first and second values of the output voltage. A control circuit coupled to the programmable circuit modifies the electrical value on the basis of required values of the output voltage.

According to one aspect of the invention, the charge circuit of the voltage generator includes a voltage regulator that generates the first and second values of the output voltage, and the discharge circuit includes a discharge circuit connected to the output terminal, which is activated when the electrical value is modified from one of the first values to one of the second values.

According to other aspects of the invention, the voltage generator additionally includes an amplifier having a first input receiving a reference value, a second input coupled to a feedback node, and an output connected to a drive element interposed between a supply line and the output terminal. The programmable circuit also includes a programmable resistive divider having a first terminal connected to the output terminal, a second terminal connected to a reference potential line, i.e., ground, and an intermediate node forming the feedback node, wherein the programmable resistive divider is formed having a programmable resistance.

According to yet other aspects of the invention, the invention provides a method for generating a voltage which is alternately switched between first and second values, wherein the first values are greater than the second values. The method includes: setting a programmable electrical value correlated to the first and second output voltage values to a first value that corresponds to a first value selected from amongst the first output voltage values; activating a voltage regulator thereby generating the first selected output voltage value; setting the programmable electrical value to a second value that corresponds to a second value selected from amongst the second output voltage values; activating a discharge circuit to controllably bring the output voltage to a value close to the second selected output voltage value; and activating the voltage regulator thereby generating the second output voltage value.

According to other aspects of the method of the invention, the method of the invention, the setting of an electrical value further includes setting a resistance value of a voltage divider coupled to the voltage regulator and to the discharge circuit.

According to yet other aspects of the method of the invention, the method further includes deactivating the voltage regulator while activating the discharge circuit, wherein activating the discharge circuit further includes comparing a value proportional to the output voltage with a reference value; switching on a conductive element arranged between the output terminal and a reference potential line; and switching off the conductive element when the value proportional to the output voltage is equal to the reference value.

BRIEF DESCRIPTION OF THE DRAWINGS

For a clearer understanding of the invention, an embodiment is now described, purely by way of non-limiting example, with reference to the attached drawings, wherein.

DETAILED DESCRIPTION OF THE INVENTION

Figure 1:
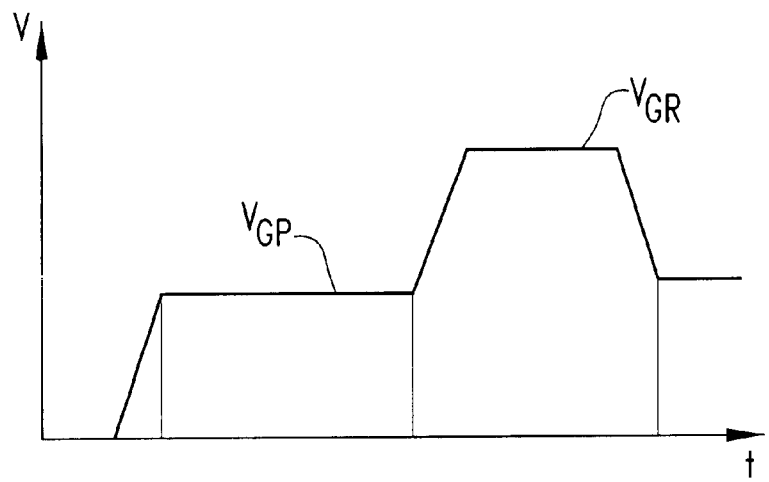
FIGS. 1 and 2 illustrate the plot of voltages applied to gate terminals of multilevel memory cells during programming, in different conditions.
Figure 2:
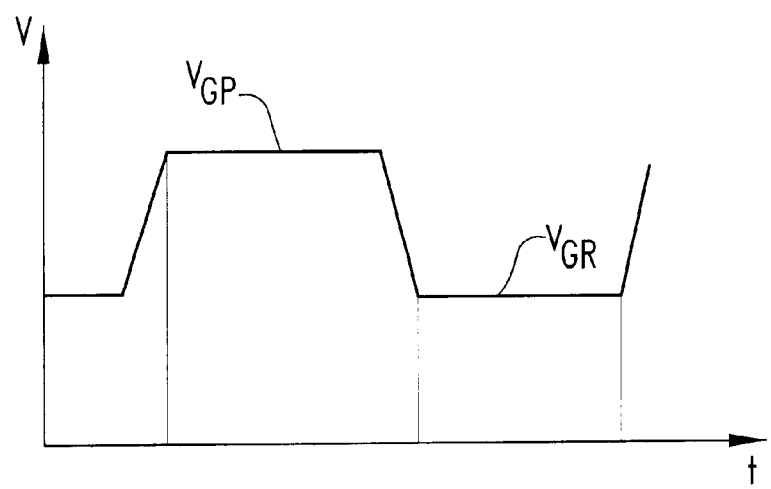
Figure 3:
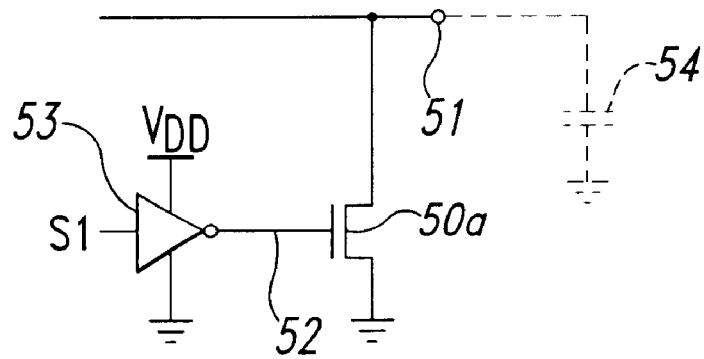
FIGS. 3 and 4 are simplified circuit diagrams of possible discharge circuits.
Figure 4:
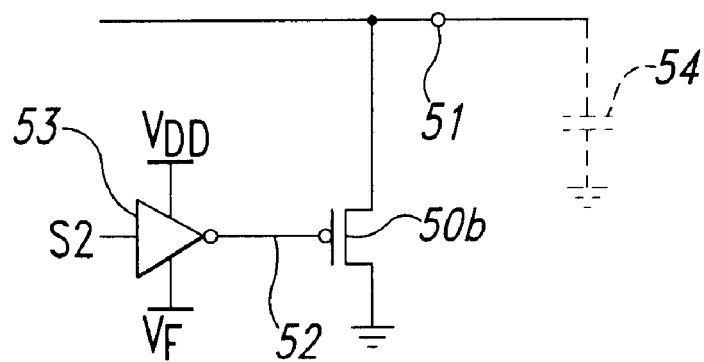
Figure 5:
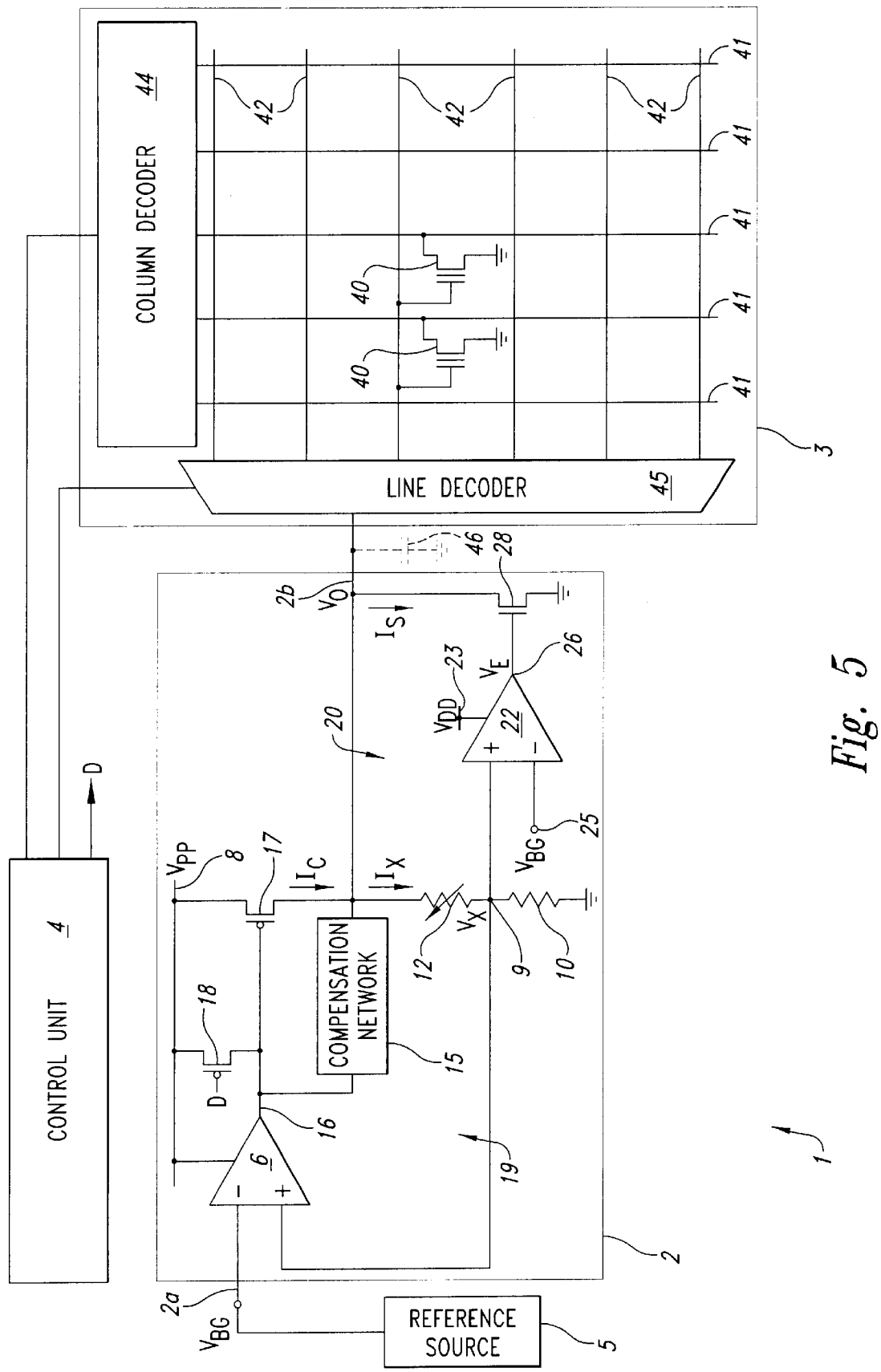
FIG. 5 illustrates a simplified circuit diagram of a memory device according to the present invention.

As shown in FIG. 5, a memory device 1 of multilevel type, comprises a voltage source 2, a memory array 3 and a control unit 4 (comprising a state machine).

The voltage source 2 has an input terminal 2a connected to a reference source 5, for example of the band-gap type, supplying a reference voltage $V_{BG}$ and an output 2b.

The voltage source 2 comprises a voltage regulator 19 and a discharge circuit 20, integrated with one another.

In detail, the voltage regulator 19 comprises a differential amplifier 6, for example an operational amplifier, which has a supply terminal connected to a first supply line 8, set to a first supply voltage $V_{PP}$ and connected for example to the output of a discharge pump (not shown), an inverting input connected to the reference source 5, and a non-inverting input connected to a feedback node 9, supplying a feedback voltage $V_X$. The operational amplifier 6 also has an output 16 connected to the gate terminal of a charge transistor 17 of PMOS type, which has a source terminal connected to line 8, and a drain terminal connected to the output terminal 2b of the voltage source 2.

A voltage divider 10, 12 is connected between the output terminal 2b and ground, and comprises a feedback resistor 10, which has constant resistance $R_1$, and a programmable resistor 12, which has variable resistance $R_C$, as illustrated in detail hereinafter. The feedback resistor 10 is connected between ground and the feedback node 9, and the programmable resistor 12 is connected between the output terminal 2b and the feedback node 9.

A compensation network 15, of known type and therefore not shown in detail, is coupled between the output terminal 2b and the output 16 of the operational amplifier 6.

A switching-off transistor 18, of PMOS type, is coupled between the first supply line 8 and the output 16 of the operational amplifier 6, and has a gate terminal which receives a control signal D, of logic type, generated by control unit 4.

The discharge circuit 20 comprises an error amplifier 22 formed (in a manner which is not shown) by a differential amplifier, and if necessary by an inverter, and as a supply terminal connected to a second supply line 23, set to a second supply voltage $V_{DD}$, a non-inverting input connected to the feedback node 9, and an inverting input 25 connected to the reference source 5, and is thus set to the reference voltage $V_{BG}$. An output 26 of the error amplifier 22 is also connected to a gate terminal of a discharge transistor 28 of NMOS type, which has a drain terminal connected to the output terminal 2b, and a source terminal connected to ground. The voltage divider 10, 12 also belongs to the discharge circuit 20, as described hereinafter.

The memory array 3 comprises a plurality of cells 40, arranged on lines and columns. The drain terminals of the cells 40 which belong to a single column are connected to a same bit line 41, whereas the gate terminals of the cells 40 arranged on a single line are connected to a same word line 42. In addition, the memory 3 comprises a column decoder 44, which can select one or more bit lines 41, and a line decoder 45, which can select a word line 42 each time, to connect it to the output terminal 2b of the voltage source 2. The column decoder 44 and the line decoder 45 are controlled in a known manner by the control unit 4.

FIG. 5 also shows with a broken line a capacitor 46, representing all the parasitic capacitances associated with the decoders, and therefore forms the capacitive load for the output terminal 2b, to be charged and discharged when switching between the program and verify steps (or vice versa).

Figure 6:
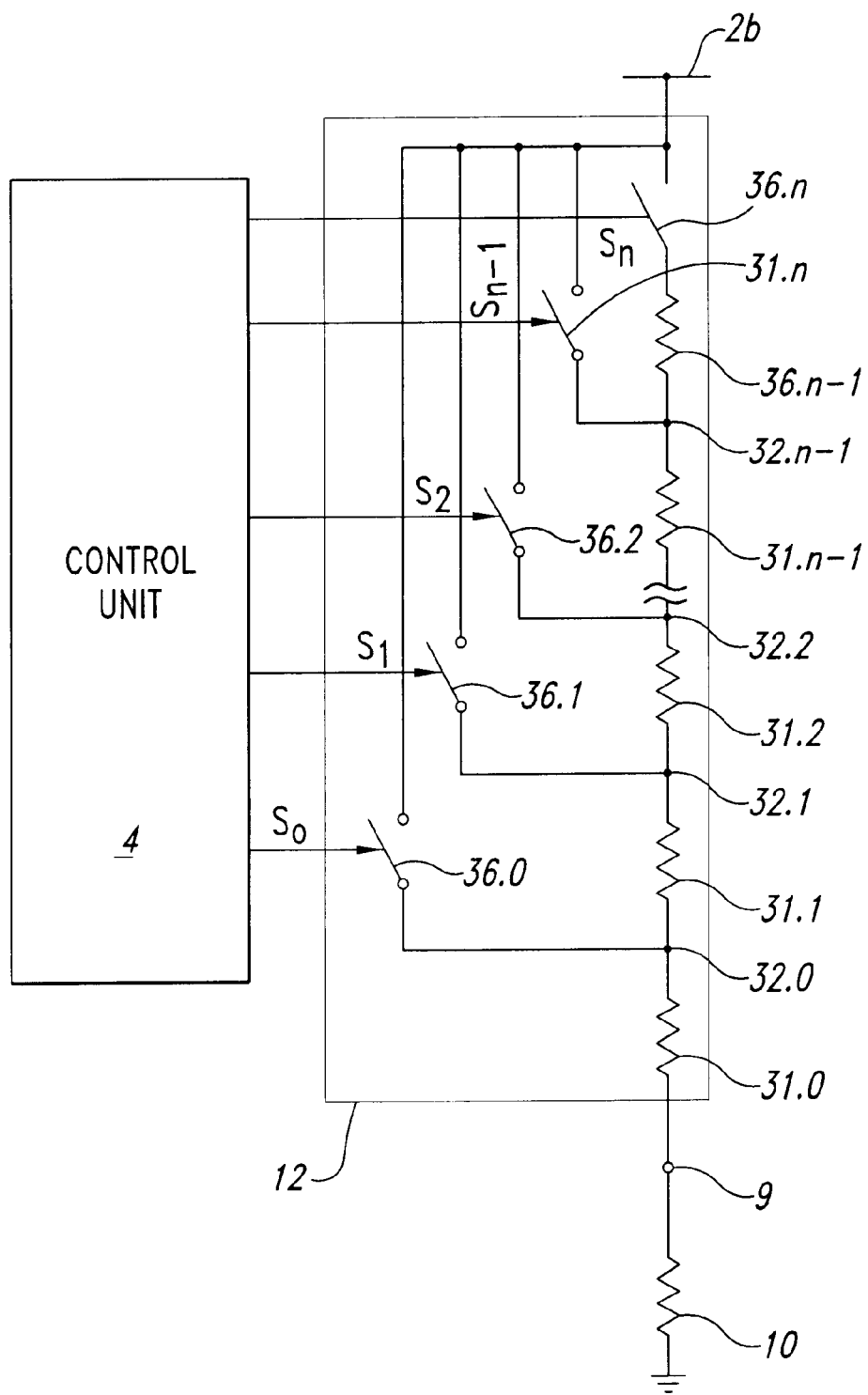
FIG. 6 shows a circuit diagram of part of the memory device of FIG. 5.

With reference to FIG. 6, the programmable resistor 12 comprises a fixed resistor 31.0, with resistance $R_O$, and a plurality of additional resistors 31.1, 31.2, . . . 31.n, with equivalent resistance $R_E$ arranged in series to each other between the output terminal 2b and the fixed resistor 31.0. Intermediate nodes 32.0, 32.1, . . . 32.n−1 between pairs of adjacent resistors 31.0, 31.1, 31.2, . . . , 31.n are connected to the output terminal 2b via respective switches 36.0, 36.1, . . . 36.n−1; in addition, a switch 36.n is arranged between the additional resistor 31.n and the output terminal 2b. Each switch 36.0, 36.1, . . . , 36.n is controlled by a respective closure signal $S_0$, $S_1$, . . . , $S_n$, where n is equivalent to the number of additional resistors 31.1, 31.2 . . . 31.n. The closure signals $S_0$, $S_1$, . . . , $S_n$, are generated by the control unit 4, which controls closure of a single one of the switches 36.0, 36.1, . . . , 36.n at a time, and keeps all the other switches open. When, for example, the switch 36.j is closed by the closure signal Sj (j being a number between 0 and n), the corresponding intermediate node 32.j is connected directly to the output terminal 2b. Consequently, the fixed resistor 31.0, and j additional resistors 31.1, 31.2, . . . , 31.j, are connected in series between the feedback node 9 and the output terminal 2b, whereas the remaining additional resistors 31.j+1, . . . , 31.n are excluded. Thus, the overall resistance RC of the programmable resistor 12 is the following:

$$RC = R0 + jRE \quad (1)$$

and varies between R0 and R0+nRE.

The memory device 1 shown in FIGS. 5 and 6 functions as follows.

During a programming cycle, including a series of program and verify steps, one or more cells 40, which generally belong to a single word line 42, are selected by the control unit 4, via the column decoder 44 and the line decoder 45; consequently, the selected word line 42 is connected to the voltage source 2, which supplies an output voltage $V_O$.

During each program or verify step, owing to the feedback to the non-inverting input of the operational amplifier 6, the output voltage $V_O$ depends on the reference voltage $V_{BG}$ and on the instant resistance $R_C$ of the programmable resistor 12, according to the expression:

$$V_O = V_{BG}\left(1 + \frac{R_C}{R_1}\right) \quad (2)$$

i.e., $$V_O = V_{BG}\left(1 + \frac{R_0 + jR_E}{R_1}\right) (j = 0, 1, ..., n) \quad (3)$$

In the first program step, the control unit 4 initially connects only the fixed resistor 31.0 between the feedback node 9 and the output terminal 2b, via the switch 36.0, to obtain an initial value $V_{Oi}$ of the output voltage $V_O$ of:

$$V_{Oi} = V_{BG}\left(1 + \frac{R_0}{R_1}\right) \quad (4)$$

In the following program steps, the control unit 4 generates a suitable sequence of closure signals $S_1$, . . . , $S_n$, so as to close each time the subsequent switch 36.1, 36.2, . . . , 36.n−1, thus increasing gradually the instant resistance $R_C$ of the programmable resistor 12. Thus, at each program step, the output voltage $V_O$ supplied to the selected cells 40 increases according to equation (3), each time with a constant increase $_\Delta V_O$ of:

$$_\Delta V_O = (R_E/R_1)V_{BG} \quad (5)$$

On the other hand, during verifying, the control unit 4 closes a single pre-determined switch from the switches 36.0, 36.1, . . . , 36.n−1, such that the output voltage $V_O$ has verify value $V_{GR}$.

During the programming cycle, initially the program voltage $V_{GP}$ is lower than the verify voltage; consequently, after each program step, the selected word line must be charged at the verify voltage, and after each verify step, the word line must be charged at the program voltage, which, as already stated, is greater than in the preceding program step. On the other hand, when the program voltage reaches and exceeds the verify voltage, the selected word line must be charged to the program value planned for the step concerned, and must be discharged to be subsequently verified.

In practice, the capacitor 46 must be alternately charged and discharged with values which are different on each step.

In the first part of the programming cycle, when the program voltage is lower than the verify voltage, during verifying, the voltage regulator 19 controls the charge transistor 17 to supply a charge current $I_C$ to capacitor 46. In this step, the instant resistance $R_C$ of the programmable resistor 12 is set according to the required output voltage value $V_O$, equal to the fixed verify value $V_{GR}$.

At the end of each verify step, the discharge circuit 20 discharges the capacitor 46 to a close value to program voltage $V_{GP}$; then, the voltage regulator 19 regulates the output voltage $V_O$ to the precise value of the program voltage $V_{GP}$.

On the other hand, in the second part of the programming cycle, when the program voltage is greater than the verify voltage, the voltage regulator 19 brings the output voltage $V_O$ to the required program value; then, at the end of each program step, the discharge circuit 20 brings the output voltage $V_O$ close to the verify value $V_{GR}$. Then, the voltage regulator 19 precisely controls the output voltage $V_O$ to verify value $V_{GR}$.

In particular, in the first part of the programming cycle, at the start of a verify step. the control signal D switches to a high state, thus switching off the switching-off transistor 18, and allowing the charge transistor 17 to switch on. The temporary resistance $R_C$ is set to the verify value, as above described. Then, through the feedback loop, including charge transistor 17, voltage divider 10, 12 and operational amplifier 6, the regulator sets the output terminal $V_O$ to $V_{GR}$. In this phase, the discharge circuit 20 is automatically deactivated, due to the imbalance between the inputs of error amplifier 22.

At the end of the verify step, the output voltage $V_O$ must be discharged to a value close to an instant value of the program voltage. Consequently, the control unit 4 switches the control signal D to the low state, the switching-off transistor 18 turns on and causes the charge transistor 17 to switch off. Simultaneously, the control unit 4 reduces the instant resistance $R_C$ to the value required for the desired instant program voltage $V_{GP}$.

When the instant resistance $R_C$ is reduced, at the feedback node 9 there is a current pulse caused by the excess current obtained from the equivalent capacitor 46. The amplitude of the excess current depends on the difference between the voltage in the preceding verify step, and the voltage required in the present program step. Then, the error amplifier 22 switches on the discharge transistor 28, which begins to conduct current for discharging the capacitor 46, until the voltage $V_X$ at the feedback node 9 becomes smaller than $V_{BG}$. At this point, the error amplifier 22 turns off the discharge transistor 28, and stops the discharge of the output voltage $V_O$. Subsequently, the voltage regulator 19 intervenes once more, and takes the output voltage $V_O$ to the planned program voltage $V_{GP}$.

Figure 7:
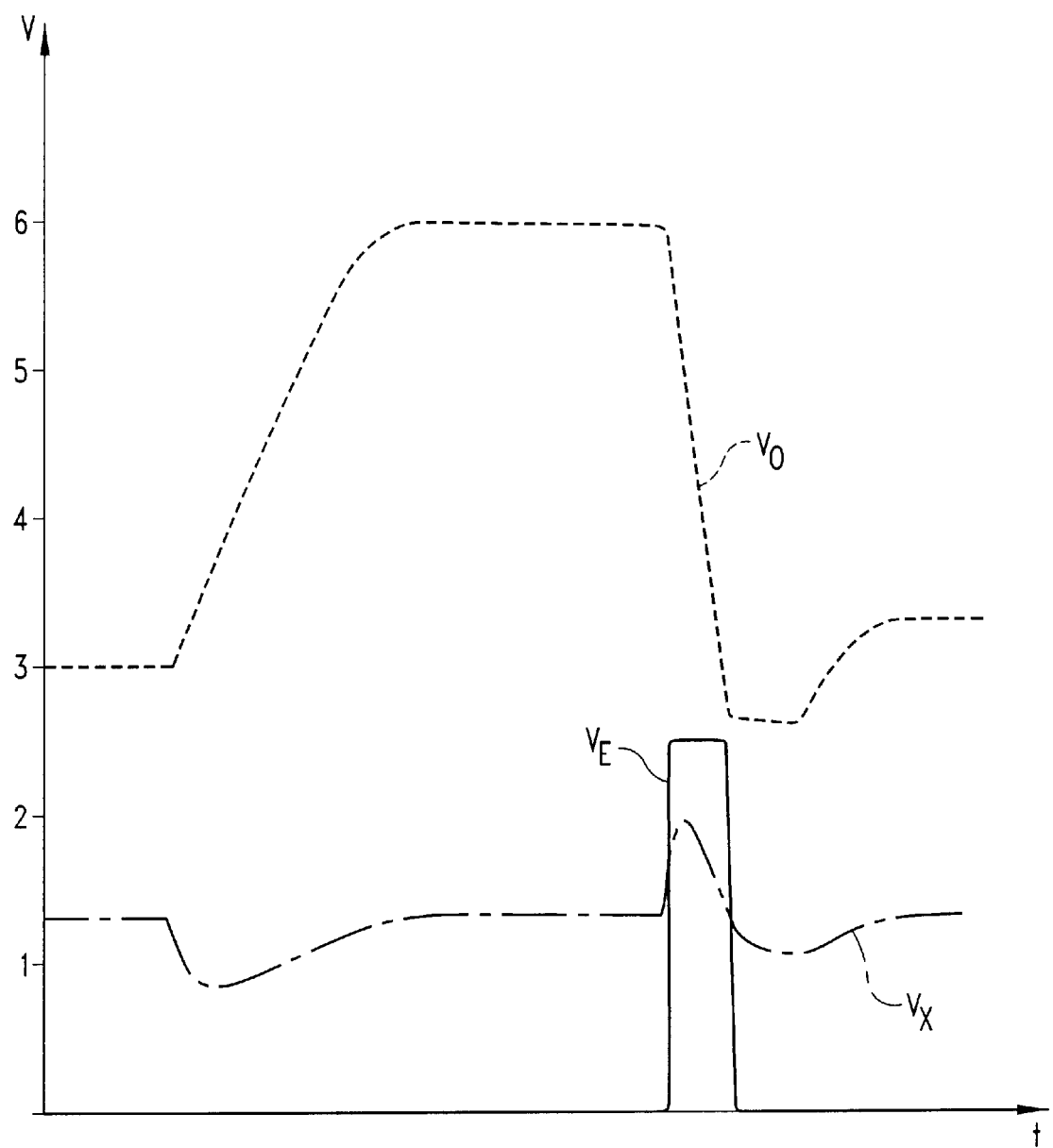
FIG. 7 shows the plot of some electrical values measured on the device of FIG. 5.

This behavior is shown in FIG. 7, which shows the plot of the output voltage $V_O$, the output signal $V_E$ of the error amplifier 22, and the voltage $V_X$ at the feedback node 9.

At the end of the program step, the control unit 4 modifies once more the value of the instant resistance $R_C$, and activates the charge transistor 17 once again via the transistor 18, which is activated by the signal D, in order to obtain a verify step.

In the second part of the program cycle, the operation is similar to the above described, with the difference that the discharge takes place at the end of the program steps, instead of at the end of the verify steps.

The described memory device 1 has the following advantages.

First, it has reduced dimensions, since the voltage source 2 generates both the discrete-ramp voltage necessary for programming the cells 40, and the read voltage, to be supplied during verifying. In addition, the charging circuit 19 and the discharge circuit 20 share the voltage divider 10, 12.

In addition, it eliminates unnecessary consumption, since the output voltage $V_O$ never reaches 0 V, but is discharged only to the value required in the subsequent program or verify step, and is then charged once more by the latter. This provides for lower power absorption, and shorter transients.

The deactivation of the charge transistor 17 during the discharge step allows a further reduction in consumption, and makes the discharge step more efficient.

Finally, it is apparent that modifications and variations can be made to the described memory device, without departing from the scope of the present invention. For example, the error amplifier 22 can be deactivated by any means, for example by disconnecting its non-inverting input from the feedback node 9, or simply by disconnecting its output from the gate terminal of the transistor 28. In addition, the transistors can be replaced by elements with opposite conductivity or by bipolar transistors.

We claim:

1. A voltage generator having an output terminal supplying an output voltage alternately switching between first and second values, said first values being greater than said second values, said voltage generator comprising:
    a charge circuit and a discharge circuit both connected to said output terminal;
    a programmable circuit shared by said charge and discharge circuits and having a programmable electrical value correlated to said first and second values of said output voltage; and
    a control unit connected to said programmable circuit and modifying said electrical value on the basis of required values of said output voltage;
    wherein said charge circuit includes a voltage regulator generating said first and second values of the output voltage,
    and said discharge circuit includes discharge means connected to said output terminal and activated when said electrical value is modified from one of said first values to one of said second values.

2. A generator according to claim 1, wherein said voltage regulator further comprises an amplifier having a first input receiving a reference value ($V_{BG}$), a second input connected to a feedback node, and an output connected to a drive element interposed between a supply line and said output terminal, and said programmable circuit further comprises a programmable resistive divider having a first terminal connected to said output terminal, a second terminal connected to a reference potential line, and an intermediate node forming said feedback node, said programmable resistive divider having programmable resistance.

3. A generator according to claim 2, wherein said programmable resistive divider further comprises:
    a first resistor, coupled between said feedback node and said reference line;
    a plurality of resistive elements, arranged in series between said output terminal and said feedback node, said resistive elements defining a plurality of intermediate nodes; and
    a plurality of controlled switch means interposed between said output terminal and a respective intermediate node.

4. A generator according to claim 3, wherein said resistive elements further comprise a fixed resistor having a first resistance, and a plurality of additional resistors substantially equal to each other and with substantially the same resistance.

5. A generator according to claim 2, wherein said drive element further comprises a MOS transistor, and comprising disabling means for said MOS transistor.

6. A generator according to claim 5, wherein said MOS transistor is of the PMOS type, and said disabling means further comprises a switching-off transistor coupled between said supply line and said control terminal of said drive element, said switching-off transistor having an own control terminal receiving a logic control signal from said control unit.

7. A generator according to claim 2, wherein said discharge circuit further comprises a discharge transistor having a first terminal connected to said output terminal, a second terminal connected to said reference potential line, and a gate terminal; and a comparator having a first input connected to said feedback node, a second input receiving said reference value, and an output connected to said gate terminal of said discharge transistor.

8. A generator according to claim 7, wherein said discharge transistor is of NMOS type, said first input is a non-inverting input, and said second input is an inverting input.

9. A memory device, comprising:
    a memory array having a plurality of word lines; and a voltage generator having an output terminal selectively connected to at least one of said word lines, and supplying an output voltage alternately switching between first and second values, said first values being greater than said second values, said voltage generator formed of a charge circuit having a voltage regulator generating said first and second values of the output voltage, a discharge circuit having discharge means connected to said output terminal, and automatic activation means automatically activating said discharge means when said electrical value switches from one of said first values to one of said second values;
    a programmable circuit shared by said charge and discharge circuits and having a programmable electrical value correlated to said first and second values of said output voltage; and
    a control unit connected to said programmable circuit and modifying said electrical value on the basis of required values of said output voltage.

10. A method for generating a voltage alternately switching between first and second values, said first values being greater than said second values, comprising:

setting a programmable electrical value correlated to said first and second values of said output voltage to a first value corresponding to a first value selected from amongst said first values of said output voltage;

activating a voltage regulator thereby generating said first selected value of said output voltage;

setting said programmable electrical value to a second value corresponding to a second value selected from amongst said second values of the output voltage;

activating a discharge circuit to controllably bring said output voltage to a close value to said second selected value of said output voltage; and activating said voltage regulator thereby generating said second value of said output voltage.

11. A method according to claim 10, wherein said setting said first and second programmable electrical values further comprises setting a resistance value of a voltage divider connected to said voltage regulator and to said discharge circuit.

12. A method according to claim 11, said setting a resistance value further comprises:

connecting a fixed resistor of said voltage divider to said output terminal thereby obtaining an initial value of said output voltage;

series-connecting a predetermined plurality of additional resistors thereby obtaining a reading value of said output voltage;

repeating the steps of:
connecting an additional resistor to said voltage divider, thereby obtaining a ramp output voltage increasing with respect to said initial value; and
connecting said predetermined plurality of series-connected resistors, thereby obtaining said reading value.

13. A method according to claim 11, further comprising deactivating said voltage regulator while activating said discharge circuit.

14. A method according to claim 11, wherein said activating said discharge circuit further comprises:

comparing a value proportional to said output voltage with a reference value; switching on a conductive element arranged between said output terminal and a reference potential line; and switching off said conductive element when said value proportional to said output voltage is equal to said reference value.

15. A voltage generator comprising:

a voltage source having a voltage regulator integrated with a discharge circuit both coupled to an output of said voltage source;

first and second output voltages generated by said voltage regulator with respective first and second values;

a control unit generating a control signal as a function of said first and second values of said output voltages;

a programmable circuit coupled to receive said control signal of said control unit and generating a programmable signal as a function of said control signal, said discharge circuit being coupled to receive said programmable signal and activate as a function thereof; and a memory array coupled to receive said output of said voltage source.

16. The voltage regulator according to claim 15, wherein said memory array further comprises a plurality of cells arranged on lines and columns, said lines being coupled to a line decoder and said columns being coupled to a column decoder, and both said line and column decoders being further coupled to said control unit.

17. The voltage regulator according to claim 15, wherein said voltage regulator further comprises an amplifier having a first input coupled to a reference value, a second input coupled to a feedback node, and an output coupled to a drive element interposed between a supply line and said output terminal.

18. The voltage regulator according to claim 17, wherein said programmable circuit further comprises a programmable resistive divider having a first terminal connected to said output terminal, a second terminal connected to a reference potential, and an intermediate node forming said feedback node.

19. The voltage regulator according to claim 18, wherein said programmable resistive divider further comprises a programmable resistive divider having programmable resistance.

20. A generator according to claim 19, wherein said discharge circuit further comprises:

a discharge transistor having a first terminal connected to said output terminal, a second terminal connected to said reference potential, and a control terminal; and a comparator having a first input connected to said feedback node, a second input receiving said reference value, and an output connected to said control terminal of said discharge transistor.

* * * * *